(12) United States Patent
Chang

(10) Patent No.: US 6,207,984 B1
(45) Date of Patent: Mar. 27, 2001

(54) CMOS SENSOR

(75) Inventor: Kuang-Yeh Chang, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/220,145

(22) Filed: Dec. 23, 1998

(51) Int. Cl.⁷ .......................... H01L 31/062; H01L 31/113
(52) U.S. Cl. .......................... 257/291; 292/294; 292/435; 292/448; 438/66
(58) Field of Search .................................. 257/448, 435, 257/292, 291, 294; 438/66

(56) References Cited

U.S. PATENT DOCUMENTS

| | | | |
|---|---|---|---|
| 5,712,494 | * | 1/1998 | Akiyama et al. ...................... 257/59 |
| 5,773,859 | * | 6/1998 | Veno ...................................... 257/294 |
| 5,918,137 | * | 6/1999 | Ng et al. ............................... 438/454 |
| 6,051,447 | * | 4/2000 | Lee et al. ............................... 438/48 |

FOREIGN PATENT DOCUMENTS

405167412 * 7/1993 (JP) .

* cited by examiner

Primary Examiner—William Mintel
(74) Attorney, Agent, or Firm—Thomas, Kayden, Horstemeyer & Risley

(57) ABSTRACT

The present invention is directed to a CMOS sensor. A substrate has a metal-oxide semiconductor. The metal-oxide semiconductor has a gate and a source/drain region in the substrate. A dummy shield layer is over a part of the substrate. A sensor region is in the substrate with one end extended from a part of the source/drain region and the other end adjacent to the part of the substrate under the dummy shield layer.

5 Claims, 4 Drawing Sheets

CMOS SENSOR

BACKGROUND OF THE INVENTION

1. Field of the Invention

The present invention relates to a structure of a semiconductor device. More particularly, the present invention relates to a structure of complementary metal-oxide semiconductor (CMOS) sensor.

2. Description of the Related Art

Charge-coupled devices (CCDs) have been the mainstay of conventional imaging circuits for converting light into an electrical signal that represents the intensity of the energy. The applications of the CCDs include monitors, transcription machines and cameras. Although CCDs have many strengths, CCDs also suffer from high costs and the limitation of the CCDs' volume. To overcome the weaknesses of CCDs and reduce costs and dimension, a CMOS photodiode device was developed. Because a CMOS photodiode device can be produced using conventional techniques, costs and the volume of the sensor can be reduced. The applications of CMOS photodiodes include PC cameras, digital cameras etc.

The photodiode is based on the theory that a P-N junction can convert light into an electrical signal. Before energy in the form of photons strikes the photodiode, there is an electric field in the P-N junction. The electrons in the N region do not diffuse forward to P region and the holes in the P region do not diffuse forward to N region. When enough light strikes the photodiode, the light creates a number of electron-hole pairs. The electrons and the holes diffuse forward to the P-N junction. While the electrons and the holes reach the P-N junction as a result of the effect of the inner electric field across the junction, the electrons flow to the N region and the holes flow to the P region. Thus a current is induced between the P-N junction electrodes. Ideally, a photodiode in the dark is open-circuit. In other words there is no current induced by light while the photodiode is in the dark.

FIG. 1A is a circuit diagram of a CMOS sensor. FIG. 1B is a layout of the sensor cell 110 in the FIG. 1A. FIG. 1C is a schematic, cross-sectional view of conventional CMOS sensor as taken along the I—I line in FIG. 1B.

As shown in FIG. 1A, the sensor array used in the latest CMOS sensor is improved from a passive pixel sensor array to an active pixel sensor array. The CMOS having the active pixel sensor array cell includes at least three active transistors 104, 106, 108 and a photodiode 102. The three active transistors are reset transistor 104, sense transistor 106 and select transistor 108. One of the source/drain regions of the transistor 104 is electrically coupled to the source voltage $V_{DD}$. One of the source/drain regions of the transistor 106 is electrically coupled to the source voltage $V_{DD}$. One of the source/drain regions of the transistor 108 is electrically coupled to the output. The sensor cell 110 comprises the transistor 104 and the photodiode 102. The photodiode 102 can convert light into an electrical signal by using the P-N junction and the electrical signal is transferred to the transistor 104.

As shown in FIG. 1B, the sensor cell 110 comprises the transistor 104 and the photodiode 102. The transistor 104 comprises a gate structure 104a, a source/drain region 104b adjacent to the gate structure 104a in the substrate. The sensor region 102a of the photodiode 102 is adjacent to the source/drain region 118 in the substrate.

As shown in FIG. 1C, the method of manufacturing the sensor cell 110 comprises providing a substrate 100 having an isolation region 112, an insulating layer 114 and a gate 104a. The insulating layer 114 can be a field oxide layer, for example. An ion implantation step is used to formed lightly doped drain (LDD) regions in portions of the substrate 100 exposed by the gate 104a and the isolation region 112. A spacer 116 is formed on the sidewall of the gate 104a. An ion implantation step is used to form heavily doped regions in portions of the substrate 100 exposed by the gate 104a, the spacer 116 and the isolation region 112. A source/drain region 104b is formed by a composition of the heavily doped region and the lightly doped drain region. A patterned photoresist (not shown) is formed over the substrate 100 to expose the region for the subsequently formed sensor region 102a. An implantation step with low energy and a high implanting dosage is performed to form a sensor region 102a across a portion of the source/drain region 118 and extending from the surface of the substrate 100 into the substrate 100.

Since the bird's beak region 112a is present at the boundary between the sensor region 112 and the sensor region 102a, the stress of the interface between the isolation region 112 and sensor region 102a is large. Because of the large stress, many crystal defects are present at the boundary between the sensor region 112 and the sensor region 102a. Therefore, the crystal defects induce large junction leakage current and dark current of the sensor. Furthermore, spots of light easily occur in the display image.

In order to overcome the problems induced by the bird's beak 112a, another conventional method of manufacturing a CMOS sensor was developed.

FIG. 2A is a layout of a sensor cell produced by another conventional method. FIG. 2B is a schematic, cross-sectional view of the conventional CMOS sensor referred to the II—II line in FIG. 2A.

Referring to FIG. 2A together with FIG. 2B, a gate 204a of a reset transistor 204 is formed on a substrate 200. A dummy shield layer 218 is formed on a isolation region 212 and covers the bird's beak region 212a. The gate 204a and the dummy shield layer 218 are formed in the same step. The region which is covered by the dummy shield layer 218 extends from the bird's beak region 212a extending 0.5 µm to the reset transistor 204 and to the isolation region 212.

Because of the dummy shield layer 218, the subsequently formed sensor region 202a and the bird's beak region 212a are staggered. Therefore, the junction leakage current is small. Since the dummy shield layer 218 extends about 0.5 µm form the bird's beak region 212a to the reset transistor 204, the size of subsequently formed sensor region 202a is limited. Furthermore, the efficiency and the effect of the sensor are poor.

SUMMARY OF THE INVENTION

It is therefore an objective of the invention to provide a structure of a CMOS sensor. The invention can overcome the problem of junction leakage current caused by the crystal defect in the bird's beak region.

It is another an objective of the invention to provide a structure of a CMOS sensor. The invention can overcome the problems that the size of the sensor region is limited by the dummy shield layer covering the bird's beak region and the efficiency and the effect of the sensor are poor.

To achieve these and other advantages and in accordance with the purpose of the invention, as embodied and broadly described herein, the invention provides a structure of a CMOS sensor. The structure comprises of a substrate having a metal oxide semiconductor, wherein the metal oxide semiconductor has a source/drain region in the substrate and a gate on the substrate. A sensor is region adjacent to the source/drain region in the substrate, and a dummy shield layer is around the sensor region on the substrate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
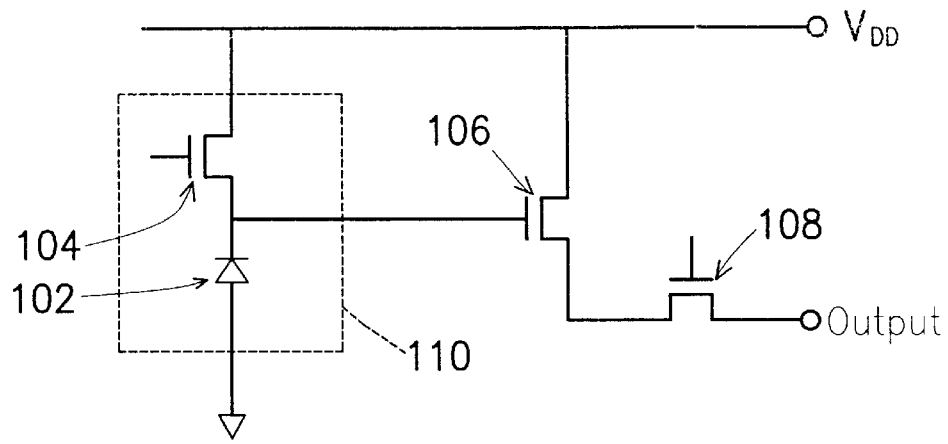
FIG. 1A is a circuit diagram of a CMOS sensor.
Figure 1B:
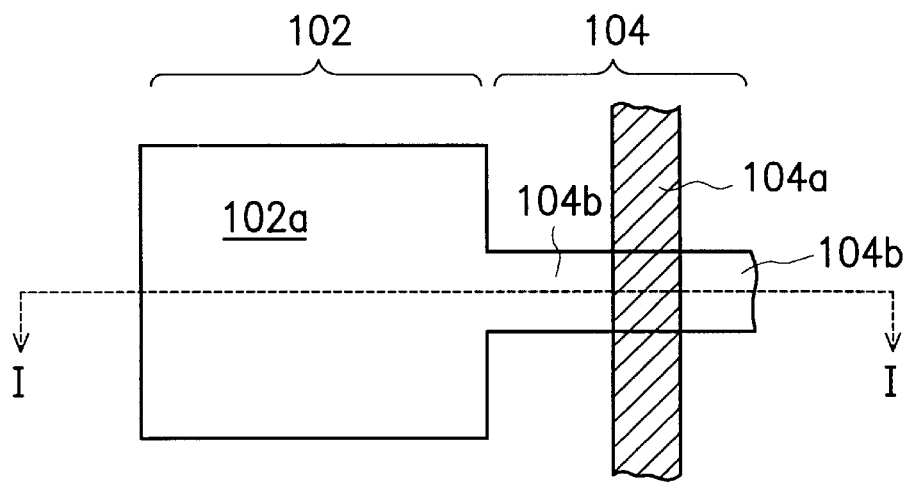
FIG. 1B is a layout of the sensor cell in the FIG. 1A.

Reference will now be made in detail to the present preferred embodiments of the invention, examples of which are illustrated in the accompanying drawings. Wherever possible, the same reference numbers are used in the drawings and the description to refer to the same or like parts.

Figure 3A:
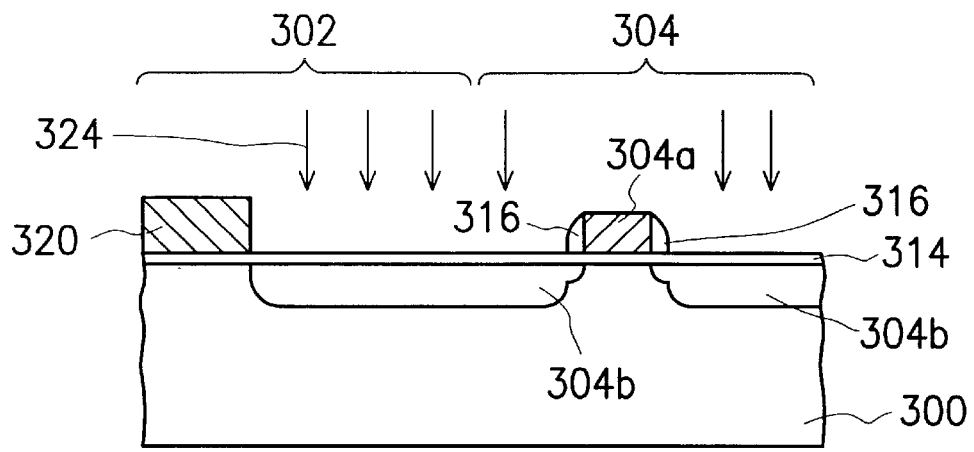
FIGS. 3A through 3C are schematic, cross-sectional views of the process for manufacturing a CMOS sensor in a preferred embodiment according to the invention.
Figure 3B:
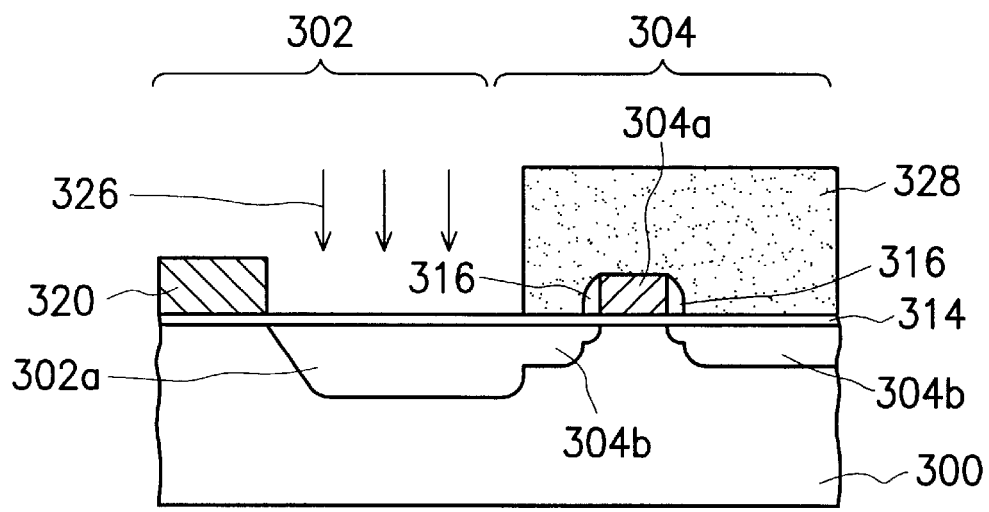
Figure 3C:
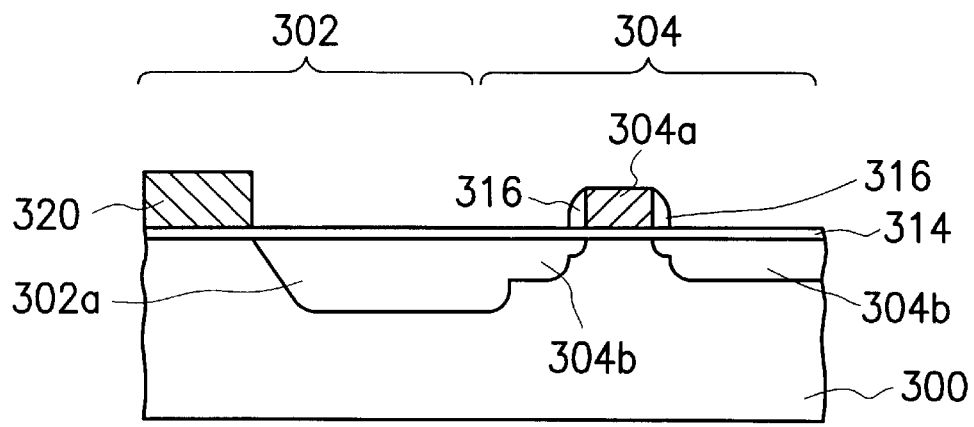

FIGS. 3A through 3C are schematic, cross-sectional views of the process for manufacturing a CMOS sensor in a preferred embodiment according to the invention.

Figure 1C:
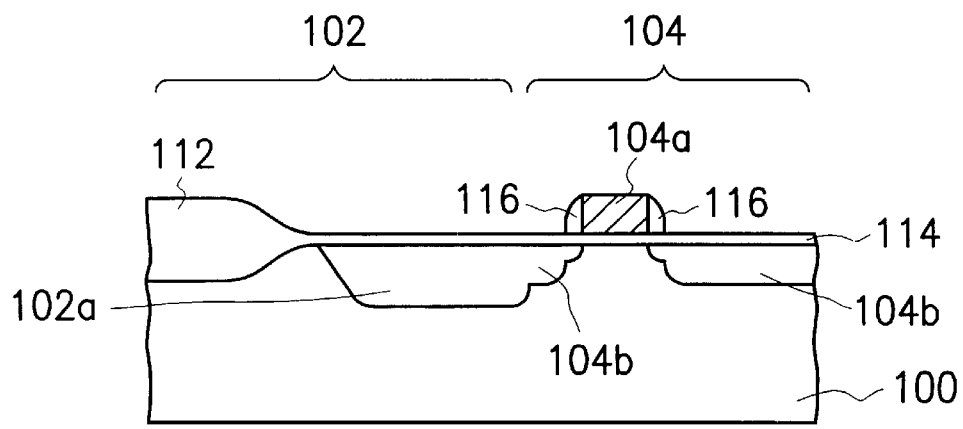
FIG. 1C is a schematic, cross-sectional view of the conventional CMOS sensor as taken substantially along line I—I in FIG. 1B.
Figure 2A:
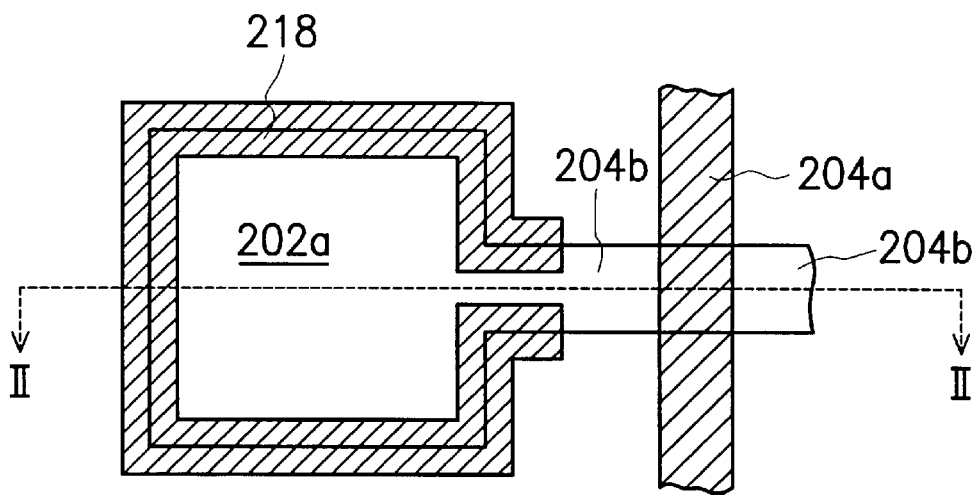
FIG. 2A is a layout of a sensor cell produced by another conventional method.
Figure 2B:
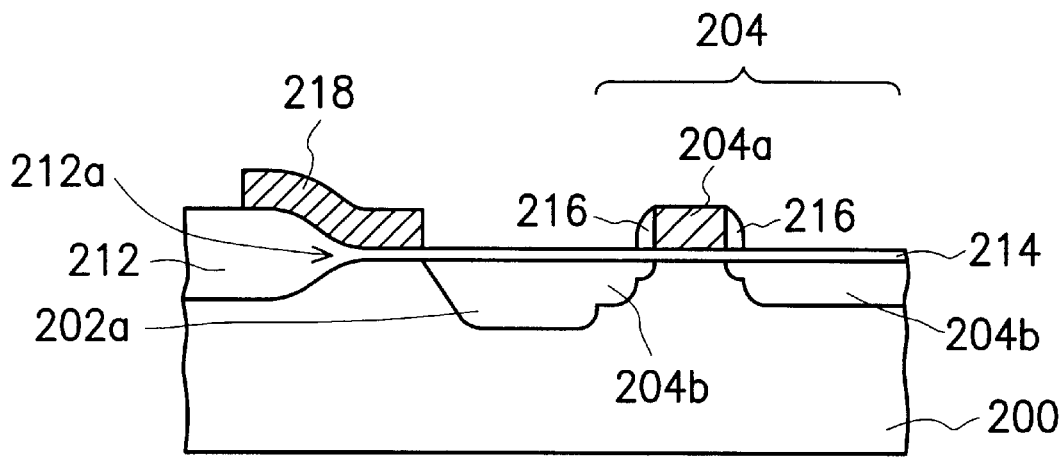
FIG. 2B is a schematic, cross-sectional view of the conventional CMOS sensor as taken substantially along line II—II in FIG. 2A.

First, as shown in FIG. 3A, a substrate 300 having an insulating layer 314 such as a silicon oxide formed by thermal oxidation is provided. The substrate 300 can be a doped well, for example. A gate 304a and a dummy shield layer 320 are formed on the insulating layer 314 in the same step. The gate 304a can be formed by a composition of a polysilicon layer formed by low-pressure chemistry vapor deposition and a polycide layer on the polysilicon layer. It is the characteristic of the invention, since there is no isolation region on the substrate 300, the surface of the substrate is plane. Furthermore, the dummy shield layer 320 is formed instead of the isolation region and defines the range for the subsequently formed sensor region, so that the problem of the junction leakage current induced by the crystal defect of the bird's beak region 112a (as shown in FIG. 1C) can be solved and the dark current of the sensor caused by junction leakage current is improved. Moreover, since there is no isolation region, the dummy shield layer 320 is not needed to stagger the bird's beak region 212a and sensor region 202a (as shown in FIG. 2B). Therefore, the size of the subsequently formed sensor region would not be limited and the efficiency and the effect of the sensor can be improved. Additionally, since there is no isolation region, the process for manufacturing a sensor and the layout of the sensor are simplified and the integration of the device is increased.

Next, a source/drain region 304b is formed adjacent to the gate 304a in the substrate 300. In this example, the steps of forming the source/drain region 304b comprise performing a LDD process to form a LDD region in the substrate 300 exposed by the gate 304a and the dummy shield layer 320. Then, a spacer 316 is formed on the sidewall of the gate 304a. A heavily doped process 324 is performed to form a heavily doped region in the substrate 300 exposed by the gate 304a, the spacer 316 and the dummy shield layer 320. The source/drain region 304b is formed by a composition of the LDD region and the heavily doped region. The dosage of the LDD process is low and the preferred dosage is about $10^{13}$ atoms/cm$^2$. The utility of the LDD region is to prevent the source/drain region 304b from the short channel effects. The dosage of the heavily doped process 324 is high and the preferred dosage is about $10^{15}$ atoms/cm$^2$ and the preferred implantation energy is about below 100 KeV.

As shown in FIG. 3B, an ion implantation step 326 is used to form a sensor region 302a in the substrate 300 exposed by a photoresist 328 and the dummy shield layer 328, wherein the sensor region 302a is adjacent to the dummy shield layer 328 and across a portion of the source/drain region 304b and extending from the surface of the substrate 300 into the substrate 300. The dopant types of the sensor region 302a and the substrate 300 are different. The dosage of the ion implantation step 326 is low and the preferred dosage is about $10^{13}$ atoms/cm$^2$–$5.0 \times 10^{14}$ atoms/cm$^2$ and the preferred implantation energy is about 30 KeV.

As shown in FIG. 3C, the photoresist 328 is stripped away to expose the transistor 304.

Figure 3D:
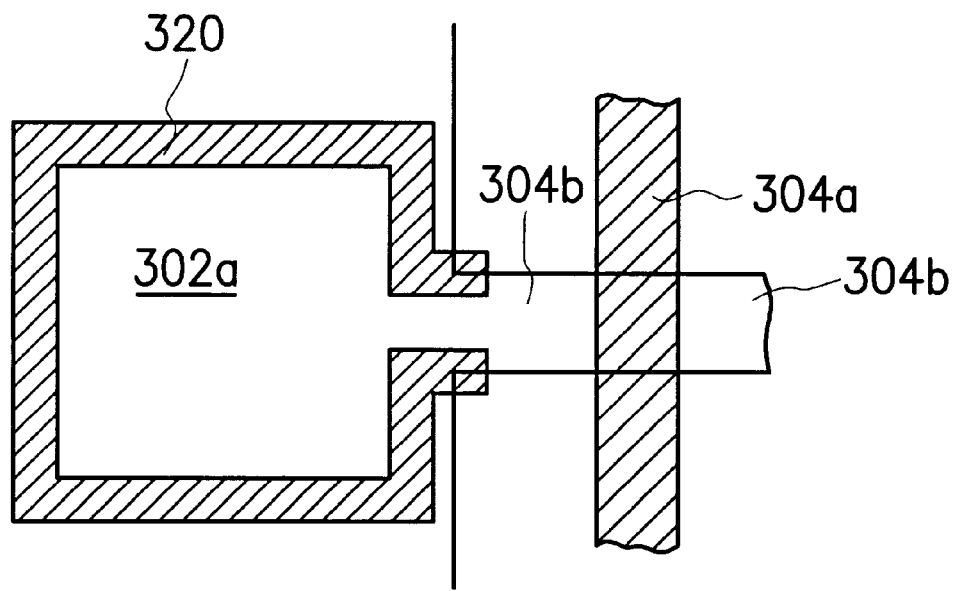
FIG. 3D is a layout of a sensor cell produced by the invention referred to the FIG. 3C.

FIG. 3D is a layout of a sensor cell produced by the invention referred to the FIG. 3C. In FIG. 3D, the dummy shield layer 320 surround the sensor region 302a, and one of the source/drain region 304b of the transistor 304 is adjacent to the sensor region 302a.

Altogether, the characteristics of the present invention include the following:

1. In the invention, since there is no isolation region on the substrate, the surface of the substrate is plane. The problem of the junction leakage current induced by the crystal defect of the bird's beak region can be overcome.

2. In the invention, since there is no isolation on the substrate, the dummy shield layer is unnecessary to stagger the bird's beak region and sensor region. Therefore, the size of the sensor region would not be limited and the efficiency and the effect of the sensor is improved.

3. In the invention, since there is no isolation on the substrate, the process for manufacturing a sensor and the layout of the sensor are simplified and the integration of the device is increased.

4. The invention is suitable for manufacturing high integration device, and the invention and the conventional process techniques are compatible; thus the present invention is suitable for the manufacturers to utilize.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A structure of a CMOS sensor, comprising:

a substrate, having a metal oxide semiconductor, wherein the metal oxide semiconductor has a source/drain region in the substrate and a gate on the substrate;

a dummy shield layer, on a part of the substrate which does not comprise an isolation region; and a sensor region, in the substrate with one end extended from a part of the source/drain region and the other end adjacent to the part of the substrate under the dummy shield.

2. The structure of claim 1, wherein the dummy shield layer includes a polysilicon layer.

3. The structure of claim 1, wherein the CMOS sensor further comprises, an insulating layer between the dummy shield layer and the substrate.

4. The structure of claim 1, wherein dopant types of the sensor region and the substrate are different.

5. The structure of claim 1, wherein the gate is formed by a composition of a polysilicon layer and a polycide layer on the polysilicon layer.

* * * * *